(12) United States Patent
Huntington

(10) Patent No.: US 7,432,537 B1
(45) Date of Patent: Oct. 7, 2008

(54) AVALANCHE PHOTODIODE STRUCTURE

(75) Inventor: Andrew S. Huntington, Beaverton, OR (US)

(73) Assignee: Voxtel, Inc., Beaverton, OR (US)

( * ) Notice: Subject to any disclaimer, the term of this patent is extended or adjusted under 35 U.S.C. 154(b) by 310 days.

(21) Appl. No.: 11/285,973

(22) Filed: Nov. 23, 2005

Related U.S. Application Data

(60) Provisional application No. 60/596,295, filed on Sep. 14, 2005.

(51) Int. Cl.
*H01L 31/107* (2006.01)

(52) U.S. Cl. .......... 257/186; 257/21; 257/199; 257/438; 257/E31.064; 257/E31.116

(58) Field of Classification Search .......... 257/21, 257/183, 184, 186, 191, 199, 438, E31.064, 257/E31.116
See application file for complete search history.

(56) References Cited

U.S. PATENT DOCUMENTS

| 6,747,296 B1 | 6/2004 | Clark |
| 2002/0074555 A1* | 6/2002 | Kim et al. .......... 257/79 |
| 2004/0178421 A1* | 9/2004 | Kuan et al. .......... 257/186 |

* cited by examiner

*Primary Examiner*—Evan Pert
*Assistant Examiner*—Eduardo A Rodela
(74) *Attorney, Agent, or Firm*—John Smith-Hill; Smith-Hill and Bedell

(57) ABSTRACT

An avalanche photodiode (APD) includes an anode layer, a cathode layer, an absorption layer between the anode layer and the cathode layer, a first multiplying stage between the absorption layer and the cathode layer, a second multiplying stage between the first multiplying stage and the cathode layer, and a carrier relaxation region between the first and second multiplying stages. Each multiplying stage includes, in the direction of drift of electrons, a first layer that is doped with acceptors, a second layer that is substantially undoped, a third layer that is doped with acceptors, a fourth layer that is substantially undoped, and a fifth layer that is doped with donors.

14 Claims, 3 Drawing Sheets

ABSORPTION  CHARGE  MULTIPLICATION LAYER

AVALANCHE PHOTODIODE STRUCTURE

CROSS REFERENCE TO RELATED APPLICATION

This application claims benefit of Provisional Application No. 60/596,295 filed Sep. 14, 2005, the entire disclosure of which is hereby incorporated by reference herein.

BACKGROUND OF THE INVENTION

This invention relates to an avalanche photodiode (APD) structure, and more particularly to an APD structure with high multiplication gain and low excess multiplication noise.

Referring to FIG. 1, a typical electron-multiplying SACM (separate absorption, charge, multiplication) APD has a p-doped anode and an n-doped cathode, and between the anode and cathode, in sequence, an absorption layer, a charge layer and a multiplication layer. The APD is used in a reverse bias mode, with the anode of the diode connected to the cathode (negative terminal) of a DC supply and the cathode of the diode connected to the anode (positive terminal) of the DC supply. The material and thickness of the absorption layer (typically InGaAs for near-infrared applications between 1000-1700 nm) is chosen so that there is a relatively high probability that a photon in the desired wavelength range incident upon the APD will generate an electron/hole pair (high quantum efficiency). The macroscopic electric field in an APD junction biased for operation (i.e. the field relevant to the function of the device through its influence on the average motion and energy of charge carriers) causes the hole to drift towards the anode and the electron to drift towards the cathode.

Generally, APDs to be operated in linear (proportional) mode are designed to preferentially avalanche one carrier type, because this condition minimizes the statistical variation of avalanche gain around its mean value (multiplication noise). The choice of preferred carrier type is usually dictated by selection of the multiplication layer material, as contrast between carrier ionization rates is a fundamental material property. For the purpose of the following discussion we shall assume that electrons are the preferred charge carriers unless the context indicates otherwise. It should be understood that the carrier roles can be reversed as dictated by the choice of multiplication layer materials, with attendant reversal of the ordering of absorption, charge, and multiplication layers between the anode and cathode of the APD.

A SACM APD is doped so that the macroscopic electric field in its multiplication layer is higher than in other depleted sections of the APD. Carriers that drift through the multiplication layer are therefore accelerated to relatively high energy levels, and a small population of unusually energetic carriers attain sufficient energy to impact-ionize. Secondary electron/hole pairs created by the collision of energetic carriers with the lattice add to the current flowing in the junction, and are themselves accelerated by the electric field. Secondary holes will drift towards the anode and secondary electrons will drift towards the cathode, possibly impact-ionizing themselves. In this manner, for each primary electron that is photoelectrically generated in the absorber layer, multiple secondary electrons are generated in the multiplication layer and collected at the anode of the DC supply; the average ratio of secondaries to primaries is the multiplication gain of the APD. In the limit of high ionization rates for both carrier types, a positive feedback condition can be established, and the APD will undergo avalanche breakdown. Avalanche breakdown renders the junction conductive, and the multiplication gain essentially goes to infinity.

The propensity of a carrier to impact-ionize depends upon several variables, including its overlap with accessible states that might participate in an ionizing collision, and their density. These factors are jointly constrained by the carrier's energy and the band structure of the semiconductor involved; the existence of a band gap means that below a certain threshold carrier energy, no accessible states will exist for an ionizing collision. Accordingly, different semiconductor materials are characterized by different ionization threshold energies, which roughly track their band gap. Details of band structure and material-dependent transport properties are also responsible for contrast between the carrier ionization rates in the same material.

Since a carrier must accumulate kinetic energy to impact-ionize, and since constant random scattering with phonons and other carriers acts to dissipate accumulated energy, measurable impact-ionization does not turn on until the applied field is so high that carriers have a reasonable probability of accumulating the necessary ionization threshold energy between scattering events. Thus, a relatively high electric field (e.g. 400 kV cm$^{-1}$ or higher) must be created in the multiplication layer to obtain useable avalanche gain. The field strength required depends upon the material used (e.g. InAlAs) and factors affecting the scattering rate (mean free path), such as lattice temperature and incidence of scattering centers. The material of the absorber layer (typically InGaAs as mentioned above) may have a considerably lower breakdown field than that of the multiplication layer (e.g. about 250 kV cm$^{-1}$). The thickness and doping of the charge layer are selected to allow the high field to exist in the multiplication layer while a substantially lower field exists in the absorber layer.

The characteristics of the multiplication layer that favor creation of a secondary electron/hole pair from an impact by an electron will generally also favor creation of a secondary electron/hole pair from an impact by a hole, although as noted above, the degree to which each type of collision is favored may contrast.

The signal to noise ratio of an optical receiver based on an APD depends on the excess multiplication noise which in turn depends on the ratio of hole and electron ionization rates in the multiplication layer. Therefore, for a given electron ionization rate, the excess multiplication noise can be reduced by reducing the probability that an impact by a hole will create a secondary electron/hole pair.

The material that is most commonly used as an absorber in an APD designed for the near infrared between 1000-1700 nm is In$_{0.53}$Ga$_{0.47}$As and the multiplication layer of such an APD is made of compound semiconductors that are compatible with In$_{0.53}$Ga$_{0.47}$As. Unfortunately, such avalanche photodiodes tend to operate with high excess multiplication noise owing to the lack of contrast between electron- and hole-initiated impact ionization rates in the materials involved. Therefore, efforts to construct avalanche photodiodes capable of operating at high multiplication gain (M>>10) with low excess multiplication noise (k$_{eff}$<<0.4) in the near infrared have not been entirely successful.

In the late 1980's and early 1990's, superlattice APDs were developed that relied upon harvesting the potential energy drop associated with carrier propagation over a band edge discontinuity. In certain superlattice material systems such as In$_{0.52}$Al$_{0.48}$As/In$_{0.53}$Ga$_{0.47}$As, the band edge discontinuity is larger in one band (the conduction band) than the other, so one carrier type (electrons) may tend to receive more of a boost in impact ionization rate than the other. Recent academic criticism has called the mechanism into question, and avalanche photodiodes with very high gain and low $k_{\it eff}$ have not resulted.

In recent years, some researchers have demonstrated suppression of excess multiplication noise by a variety of techniques collectively known as impact-ionization engineering ($I^2E$). In its simplest form, $I^2E$ uses the dead space effect to limit the total number of different ionization chains that result from a carrier injected into a thin APD multiplication layer. Dead space is the distance over which a cold carrier must drift under the influence of the multiplying junction's macroscopic electric field before it has picked up sufficient kinetic energy to initiate impact ionization. Dead space may represent a significant fraction of the total volume inside a thin multiplication layer, in which case the spatial localization of impact ionization acts to create a correlation between ionization events that ultimately lowers the multiplication noise of the APD.

A second $I^2E$ technique that has been described in the literature is the use of well-and-barrier heterostructure multiplication regions in which the difference in impact ionization threshold energy between two or more materials is exploited to enhance the impact ionization rate of one carrier type over the other. Electrons drift in the opposite direction from holes because they have opposite charge; in a thin heterostructure multiplication region with high threshold material at one end and low threshold material at the other, the ionization rate for the carrier type traveling from high threshold to low threshold will be enhanced, and that of the carrier type traveling from low threshold to high threshold will be suppressed. The reason is that the low threshold material, in which ionization is easy, will be in the dead space of one type, but not the other. A sharper contrast between ionization rates helps to reduce the number of possible ionization chains by eliminating some of those involving feedback, and so the net result is lower excess multiplication noise.

Thus far, it has not been possible to translate the low-multiplication-noise operation of $I^2E$ APDs to high gain. This limitation is a consequence of the requirement that their multiplication layers be very thin in order to benefit from the dead-space effect. A thin multiplication layer has low noise because the number of possible ionization chains is small; by the same token, the long ionization chains necessary to get high gain cannot fit inside a thin multiplication layer. Higher gain can be eked out of a thin multiplication layer by increasing the field strength, but in doing so, the contrast between ionization rates is lost, feedback is enhanced, and noise suppression is lost precisely because a larger number of ionization chains can now fit into the same space. The stronger fields not only degrade excess noise performance but also enhance dark current leakage mechanisms such as band-to-band tunneling and thermionic field emission.

It might at first appear that if individual $I^2E$ multiplication layers cannot be operated at high gain and still preserve their low noise character, it would be possible to achieve high gain by employing several multiplication layers each operating at low gain and cascading them in stages. However, simply growing a series of $I^2E$ multiplication layers is not sufficient: without some way to prevent feedback between stages, all that is obtained by stacking a series of thin multiplication layers is a single thick (and noisy) multiplication layer.

U.S. Pat. No. 6,747,296 B1 describes an avalanche photodiode with a cascaded multiplication structure, with each stage of the multiplication structure being composed of multiple layers. Each multiplying stage comprises (in the direction of travel of electrons, which are the preferred charge carriers) a layer of a first material M1 and a layer of a second material M2, the impact ionization threshold of the second material being lower than that of the first material. The layer of the first material includes (in succession, in the direction of travel of electrons) a first intrinsic region, a p-doped region, a second intrinsic region, and an n-doped region. The layer of the second material is intrinsic. Thus, the placement of doping is such as to raise the macroscopic electric field strength to its maximum in the layer of material having the higher ionization threshold, and to lower it within that layer. This multiplication structure is intended to result in the probability of an ionizing impact being a maximum when an electron enters the material M2, where the field is lower than the maximum field in the layer of the material M1.

U.S. Pat. No. 6,747,296 B1 describes a hole step-down region in connection with FIGS. 3A-3D. The function of the hole step-down region is described in terms of band edge discontinuities. Thus, various forms of grading in composition are described as either (a) preventing non-preferred charge carriers from harvesting band edge discontinuity energy to enhance their impact ionization rate, or (b) facilitating transport of preferred charge carriers across the band discontinuity in order to increase device speed. For this reason, U.S. Pat. No. 6,747,296 B1 discloses that the material used in the hole step-down region must be of intermediate band gap. U.S. Pat. No. 6,747,296 B1 does not prescribe any requirements regarding the relative electric field strength in the hole step-down regions.

SUMMARY OF THE INVENTION

According to a first aspect of the present invention there is provided an avalanche photodiode (APD) comprising an anode layer, a cathode layer, an absorption layer between the anode layer and the cathode layer, a first multiplying stage between the absorption layer and the cathode layer, a second multiplying stage between the first multiplying stage and the cathode layer, and a carrier relaxation region between the first and second multiplying stages, wherein the macroscopic field strength in the carrier relaxation region is lower than the macroscopic field strength in the first and second multiplying stages, and the carrier relaxation region is composed of a semiconductor material having a fundamental band gap that is greater than or equal to the greatest fundamental band gap of semiconductor material in the first multiplying stage and is greater than or equal to the greatest fundamental band gap of semiconductor material in the second multiplying stage.

According to a second aspect of the present invention there is provided an avalanche photodiode (APD) comprising an anode layer, a cathode layer, an absorption layer between the anode layer and the cathode layer, a first multiplying stage between the absorption layer and the cathode layer, a second multiplying stage between the first multiplying stage and the cathode layer, and a carrier relaxation region between the first and second multiplying stages, and wherein each multiplying stage comprises, in the direction of drift of electrons, a first layer that is doped with acceptors, a second layer that is substantially undoped, a third layer that is doped with acceptors, a fourth layer that is substantially undoped, and a fifth layer that is doped with donors.

All low-noise $I^2E$ multiplication regions depend on dead space in one way or another to function. The present invention is based in part on the recognition that if a hot carrier arrives at a multiplying stage with sufficient kinetic energy to ionize, then it has no dead space within that stage, and the stage cannot function as designed. Accordingly, when $I^2E$ multiplying stages are cascaded, they must be separated by carrier relaxation regions in which hot carriers can lose their energy, effectively resetting their dead space. Hot carriers normally lose their energy through collisions with other carriers and phonons, so that even under very high macroscopic electric fields, they will tend to have a maximum average velocity that is near the thermal velocity: this is known as the saturation velocity. However, as carrier scattering is a random process, under extremely high fields a portion of the carriers are able to accelerate far above the saturation velocity and attain sufficient kinetic energy to impact ionize. This is why APD multiplication regions require high internal fields to function. Simply by dropping the macroscopic electric field strength, the population of active carriers can be rapidly depleted through normal scattering mechanisms.

Manipulation of the macroscopic electric field can be used for an additional purpose. Empirical measurements have found that impact ionization rates are an exponential function of the macroscopic electric field strength. Accordingly, differences in macroscopic electric field strength can be used to enhance and suppress ionization rate. This mechanism of noise suppression through field control is a form of band engineering that can be implemented through doping during epitaxial growth.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

An embodiment of the present invention addresses the limited gain of I$^2$E multiplication layers by showing how they can be deployed to achieve high gain yet still retain their low noise properties.

Figure 1:
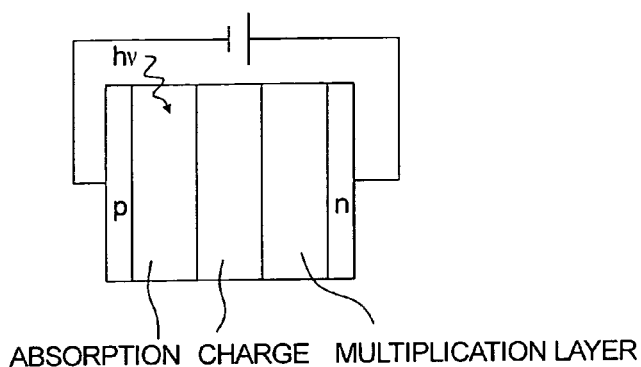
FIG. 1 is a simplified schematic view of a conventional SACM APD.
Figure 2:
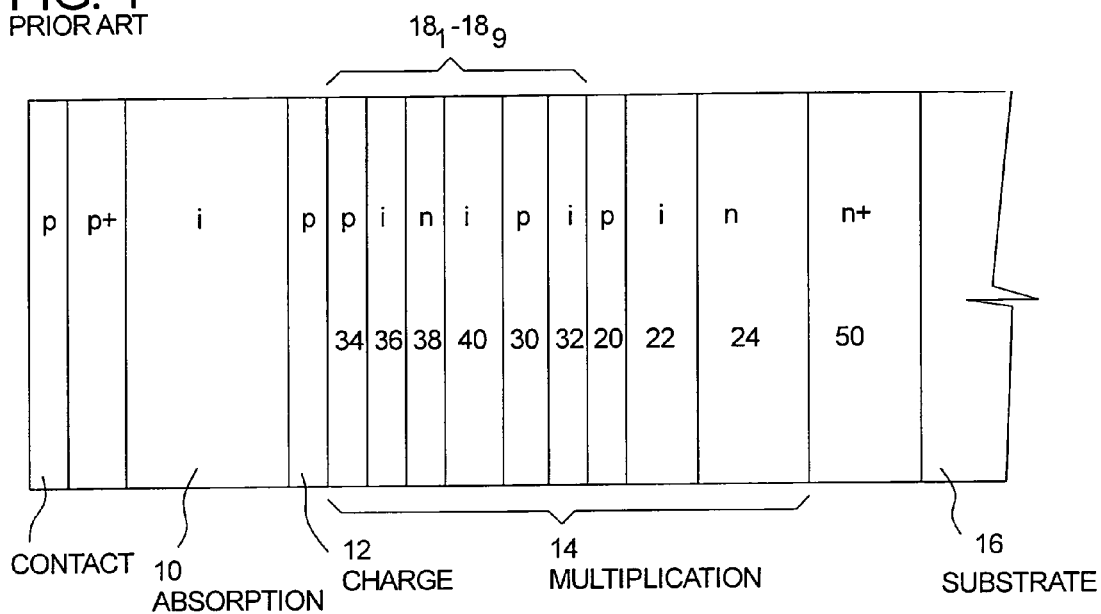
FIG. 2 is a simplified sectional view of an SACM APD embodying the present invention.
Figure 3:
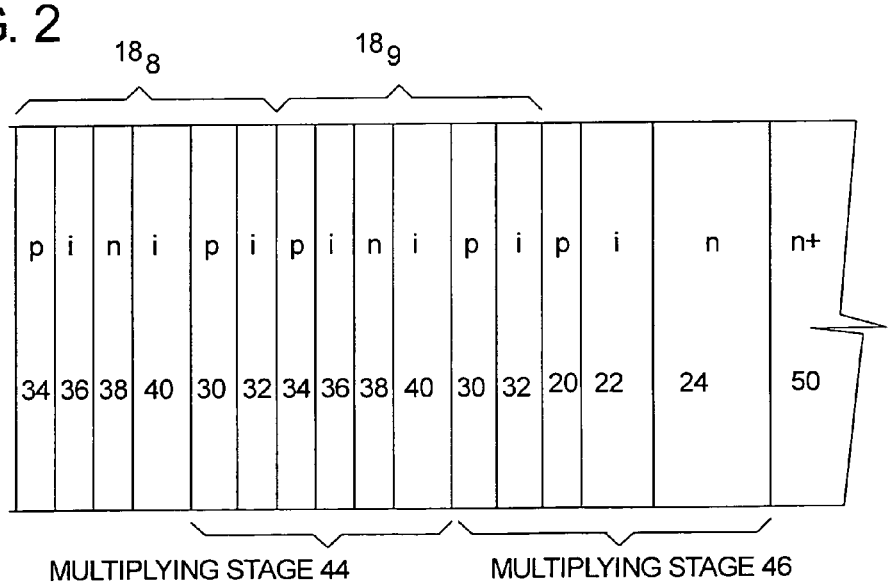
FIG. 3 is a more detailed view of one of the multiplying stages of the APD shown in FIG. 2.

The APD shown schematically in FIG. 2 comprises an absorption layer 10, a charge layer 12 and a multiplication layer 14 produced by molecular beam epitaxy on a substrate 16 of InP. The multiplication layer comprises several (nine, for example) repetitions of a multilayer sequence 18, and a sequence of transition layers 20, 22 and 24 between the last repetition of the sequence 18 and the n+ layer. FIG. 3 shows the last two repetitions of the six-layer sequence and the three transition layers.

Figure 4:
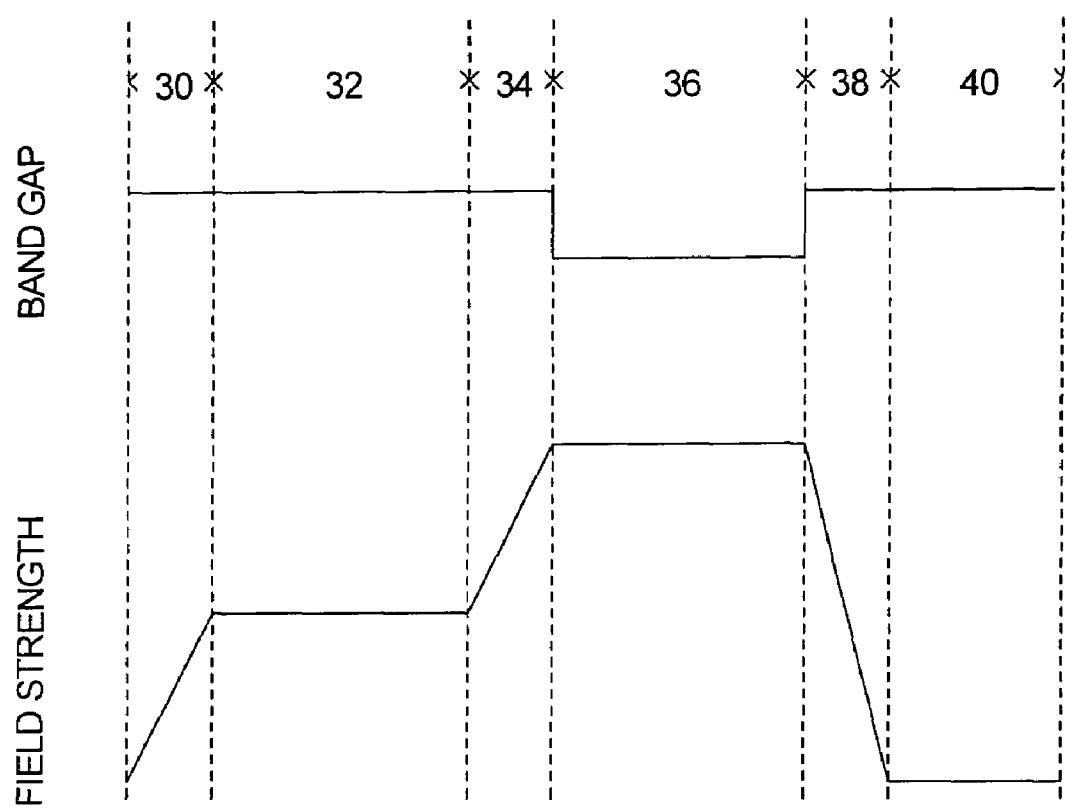
FIG. 4 is a graph illustrating both the electric field profile and the ionization threshold profile in the multiplying stage.

Referring to FIG. 3, the multiplication layer and the sequence of transition layers form ten cascaded multiplying stages, each having four distinct functional layers: a first p-doped field-up layer 30, a first intrinsic layer or plateau 32, a second p-doped field-up layer 34, a second intrinsic layer or plateau 36, an n-doped field-down layer 38, and an intrinsic, i.e. undoped, relaxation layer 40. In the first repetition of the sequence, the charge layer 12 plays the role of the first field-up layer 30 and the first intrinsic layer or plateau 32. The first field-up layer raises the electric field in the first plateau 32, the second field-up layer raises the electric field in the second plateau 36, and the field-down layer lowers the electric field in the relaxation layer 40. The doping profile therefore results in an electric field profile in each multiplying stage, traversed in the direction of drift of electrons, by which the field increases substantially in the first field-up layer 30, remains constant in the first plateau 32, increases substantially in the second field-up layer 34, remains constant in the second plateau 36, falls abruptly in the field-down layer 38, and remains constant in the relaxation layer 40, as shown in FIG. 4. As electrons traverse the multiplying stage, they are accelerated by the field in the first field-up layer 30, the first plateau 32 and the second field-up layer 34. The doping levels and dimensions of these layers are specified so that the electric field in the first plateau 32 is too low to sustain a high rate of carrier ionization. At the same time, the electric field engineered by the doping pattern is designed to insure that once electrons transit the first plateau 32 and the second field-up layer 34, the high-energy portion of the electron population traveling above the saturation velocity arrives at the second plateau 36 with sufficient energy to ionize readily. The macroscopic electric field reaches its maximum in the second plateau 36, or ionization layer. Accordingly, the impact ionization rate also reaches a maximum in the ionization layer. In order to take maximum advantage of the increase in ionization rate due to the high electric field, the ionization layer is made of a material having a lower band gap (and consequently lower ionization threshold) than the materials used for the other layers of the multiplying stage. The ionization layer is sized so that any secondary holes created by the desired impact ionization can't pick up sufficient energy to cause further ionizations before they drift out of the high-field region. In this way, electrons are encouraged to ionize preferentially in the second plateau 36, but not in the preceding layers of the multiplying stage, and without feedback. Electrons next encounter the field-down layer 38, in which the electric field strength drops rapidly below the level required to sustain impact ionization, returning to the value at the beginning of the multiplying stage. From there the electrons drift into the low-field carrier relaxation layer 40, where normal scattering processes equilibrate any remaining high-energy electrons with the general population. Accordingly, when the electrons arrive at the first field-up layer 30 of the next multiplying stage, their energy is relatively low.

A population of holes will drift through the multiplying stage in the opposite direction, and they will therefore encounter its layers in the opposite order. Layers that raise the electric field when encountered from the left lower it when encountered from the right, and vice versa, so the descriptive terms "field-up" and "field-down" are omitted here for clarity. Holes entering the stage through the carrier relaxation layer 40 arrive at ionization layer 36 with insufficient accumulated kinetic energy to ionize, despite the high field and low ionization threshold in that layer. The distance over which the holes have traveled in the increasing field is substantially less than that traveled by electrons in the opposite direction, so the total potential drop they encounter is smaller. The sudden increase in the electric field which takes place across layer 38 acts to increase the energy of the hole population, but layer 38 is sized so that the total potential drop is insufficient to boost holes above the ionization threshold energy. The holes therefore transit ionization layer 36 with a much lower probability of ionizing than the equivalent population of electrons, because they start with less energy, even though they continue to accumulate kinetic energy in the ionization layer's high electric field. The vast majority of holes enter layer 34 without having impact ionized. A small portion of high-energy holes may ionize outside the ionization layer, but the higher ionization threshold minimizes this, as does their rapid loss of energy through scattering in the successively lower fields of layers 34, 32 and 30. Ultimately most holes enter the relaxation layer 40 of the next multiplying stage without having created an electron/hole pair. In the relaxation layer 40 of the next stage, the energy gained from the field in the preceding stage is lost in collisions. Accordingly, when the holes arrive at layer 38 of the next multiplying stage their average energy is relatively low, and the process can repeat.

Thus, for each multiplying stage there is a high probability that an electron entering the second plateau will create an electron/hole pair and a small probability that a hole traversing the multiplying stage will create an electron/hole pair. Accordingly, a high multiplication gain is achieved without a commensurate increase in the excess multiplication noise associated with feedback.

The present invention thus distinguishes from the conventional superlattice APD by preventing, or at least reducing, feedback between multiplying stages.

The macroscopic electric field in the carrier relaxation layer and the layer's thickness are chosen so that carriers that have gained substantial kinetic energy from the macroscopic electric field of one multiplying stage will, with high probability, lose that accumulated kinetic energy through random collisions prior to entering the subsequent multiplying stage. In this manner, the carrier relaxation layers suppress feedback (and the associated multiplication noise) between multiplying stages by preventing "active" carriers from retaining kinetic energy between multiplying stages. Monte Carlo carrier transport simulations have shown that active carriers will only retain their energy over roughly 30 nm. However, a large proportion of carriers will lose sufficient energy to prevent ionization in the next multiplying stage if the carrier relaxation layer is about 20 nm in length. Thus, the carrier relaxation layers should be at least about 20 nm in length, although it is preferred that they be at least 30 nm in length and in the preferred embodiment of the invention they are 100 nm in length.

The final repetition 189 of the multilayer sequence is shared between the final complete multiplying stage 44 and a partial multiplying stage 46 that does not include a carrier relaxation layer. Electrons that leave the carrier relaxation layer 40 of the multiplying stage 44 traverse the succeeding layers 30 and 32 and enter the transition layer 20, which is a final field-up layer leading to a final ionization layer 22. High energy electrons that enter the layer 22 may impact ionize, as described above. The layer 24 is a final field-down layer lowering the electric field in the n⁺ layer 50. There is no need to provide a carrier relaxation layer after the field-down layer 24, because there is no ionization layer to supply holes that would enter the field-down layer 24.

The multiplying stages that are cascaded by means of the relaxation layers described with reference to FIGS. 2-4 are of the impact-ionization-engineered variety, but use of the relaxation layers is not confined to the specific multiplying stages described with reference to FIGS. 2-4 and they may be applied to multiplication stages employing different mechanisms, such as the barrier-and-well multiplying stages described in U.S. Patent Application 20030047752. The multiplication stage described with reference to FIGS. 2-4 differs from that disclosed in U.S. Patent Application 20030047752, in that macroscopic electric field strength is used in addition to material selection to raise and lower the probability of impact ionization.

FIG. 4 shows that the band gap in the ionization layer 36 is somewhat less than in the other layers of the multiplying stage. The narrow band gap in the ionization layer provides the desired contrast in ionization threshold, as explained above. Since the function of the relaxation layer 40 depends only on the reduction in electric field strength and the physical thickness of the layer, and does not require a small band gap, the band gap in the relaxation layer 40 should be at least as great as that in other layers of the multiplying stage in order to minimize dark current leakage.

Figure 5:
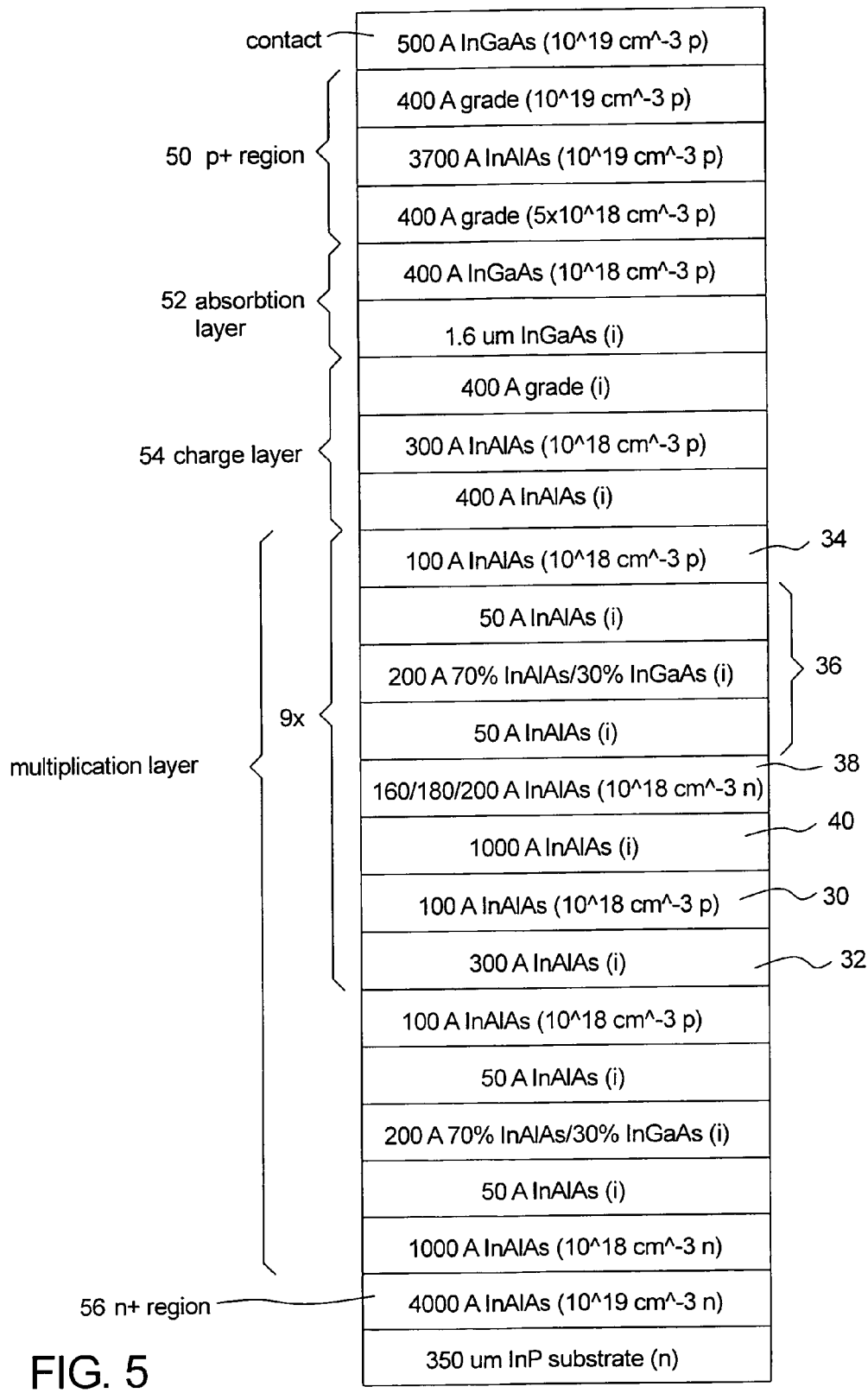
FIG. 5 is a schematic sectional view of an SACM APD embodying the present invention.

FIG. 5 illustrates a preferred SACM APD embodying the present invention.

Referring to FIG. 5, the layer 50 is a p-contact layer having a narrow band gap near the surface and a wide gap below the surface. The layer 50 provides a low-resistance electrical contact between the diode and the metallurgical contact and forms the p-side of the diode.

The absorber layer 52 is an intrinsic layer having a narrow band gap. The layer 52 efficiently absorbs the optical signal and generates photocarriers.

The charge layer 54 is lightly p-type having a wide band gap, and serves to regulate the electric field in the absorber layer and to suppress absorber leakage. It also plays the role of the first field-up and plateau layers of the very first multiplication stage.

The first field-up layer 30 is lightly p-type and has a wide band gap. The layer 30 elevates the electric field in the layer 32 relative to that in the carrier relaxation layer 40.

The plateau, or carrier heating layer, 32 is an intrinsic layer having a wide band gap. The layer 32 provides a layer in which the kinetic energy of electrons can increase.

The second field-up layer 34 is lightly p-type and has a wide band gap. The layer 34 elevates the electric field in the layer 36 relative to that in the plateau 32.

The ionization layer 36 is an intrinsic layer having a medium band gap, which is less than that of the layer 34. The ionization layer promotes impact ionization by electrons.

The field-down layer 38 is lightly n-type and has a wide band gap. The layer 38 lowers the electric field in the layer 40 relative to that in the layer 36.

The carrier relaxation layer 40 is an intrinsic layer having a wide band gap. The layer 40 allows hot holes to lose their kinetic energy in a low field layer, thereby suppress feedback between successive multiplying stages.

The layer 56 forms the n-side of the diode. In this specific embodiment, metallurgical electrical contact would be made to the conductive n-type InP substrate. It should be appreciated than an equivalent structure could be grown on a semi-insulating InP substrate, and metallurgical contact made to layer 56 directly.

The layers that are between the layers specifically identified above are specified to improve the quality of growth as well as reduce the electrical resistance of portions of the structure.

The present invention may be used to provide a technique for suppressing carrier feedback between cascaded multiplying stages inside an avalanche photodiode (APD) multiplication layer. When operated at a given average multiplication gain, an APD fabricated with a plurality of cascaded low-noise multiplying stages will operate with lower excess multiplication noise and lower dark current leakage than a substantially equivalent APD fabricated with a single such multiplying stage. In an embodiment of the invention, each multiplying stage is separated from its neighbors by carrier relaxation layers characterized by low macroscopic electric field strength. The carrier relaxation layers are designed such that carriers that have gained substantial kinetic energy from the macroscopic electric field of one multiplying stage will, with high probability, lose that accumulated kinetic energy prior to entering the subsequent multiplying stage.

The term "intrinsic" is commonly used in connection with semiconductor material to indicate that the material is not doped. However, use of the term "substantially undoped" or "intrinsic" or the abbreviation "i" in the description and the appended claims is not intended to suggest or require that the material is devoid of dopants and, in particular, is intended to cover the possibility of the material being unintentionally doped.

It will be appreciated that the invention is not restricted to the particular embodiment that has been described, and that variations may be made therein without departing from the scope of the invention as defined in the appended claims and equivalents thereof. For example, although the multiplication layer 14 of the APD shown in FIG. 2 includes nine identical multilayer sequences 18, and accordingly the average gain provided by each multiplying stage is the same as that provided by the other multiplying stages, this is at least partially for ease of manufacture and the invention includes within its scope an APD in which one or more of the multiplying stages provides a different average gain from other stage(s) or indeed each multiplying stage provides a different average gain from each of the other stages. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. If the word "comprises" or "includes," or a derivative of either of these words is used in this specification, including the claims, it is used in an inclusive, not exclusive or exhaustive, sense. Thus, for example, a statement that a component comprises first and second elements is not intended to exclude the possibility of the component including one or more additional elements.

The invention claimed is:

1. A two-terminal avalanche photodiode (APD) comprising:
   first and second electrode layers, one of said first and second electrode layers being an anode layer and the other of said first and second electrode layers being a cathode layer,
   an absorption layer between the first and second electrode layers,
   a first multiplying stage between the absorption layer and the first electrode layer,
   a second multiplying stage between the first multiplying stage and the first electrode layer, wherein the electrical potential across each stage is established by the selection of doping levels in the structure and the voltage applied across the first and second electrode layers only, so that more than one multiplying stage can be operated without making additional independent electrical contacts to the APD, and
   a carrier relaxation region between the first and second multiplying stages to which no direct external electrical contact is made,
   wherein the macroscopic field strength in the carrier relaxation region is lower than the macroscopic field strength in the first and second multiplying stages, and the carrier relaxation region is composed of an undoped semiconductor material having a fundamental band gap that is greater than or equal to the greatest fundamental band gap of semiconductor material in the first multiplying stage and is greater than or equal to the greatest fundamental band gap of semiconductor material in the second multiplying stage.

2. An APD according to claim 1, wherein at least one of the multiplying stages comprises, in the direction of drift of preferred charge carriers of one polarity, a first layer that is doped with dopant that generates free charge carriers of opposite polarity to said one polarity, a second layer that is substantially undoped, a third layer that is doped with dopant that generates free charge carriers of said opposite polarity, a fourth layer that is substantially undoped, and a fifth layer that is doped with dopant that generates free charge carriers of said one polarity.

3. An APD according to claim 2, wherein the fourth layer comprises a semiconductor of fundamental band gap less than that of the materials of the third and fifth layers.

4. An APD according to claim 1, wherein at least one of said multiplying stages comprises, in the direction of drift of electrons, a first layer that is doped with acceptors, a second layer that is substantially undoped, a third layer that is doped with acceptors, a fourth layer that is substantially undoped, and a fifth layer that is doped with donors.

5. An APD according to claim 1, wherein the carrier relaxation region has a thickness greater than 20 nm.

6. An APD according to claim 1, comprising at least one additional multiplying stage between the second multiplying stage and the first electrode layer and, for each additional multiplying stage, an additional carrier relaxation region between the second multiplying stage and said additional multiplying stage, and wherein each carrier relaxation region is located between two consecutive multiplying stages in the direction of drift of preferred charge carriers, and each additional multiplying stage is located either between two consecutive carrier relaxation regions in said direction or between a carrier relaxation region and the first electrode layer.

7. An APD according to claim 1, wherein the first electrode layer is the cathode layer.

8. An avalanche photodiode (APD) comprising:
   an anode layer,
   a cathode layer,
   an absorption layer between the anode layer and the cathode layer,
   a first multiplying stage between the absorption layer and the cathode layer,
   a second multiplying stage between the first multiplying stage and the cathode layer, and
   a carrier relaxation region between the first and second multiplying stages,
   and wherein each multiplying stage comprises, in the direction of drift of electrons, a first layer that is doped with acceptors, a second layer that is substantially undoped, a third layer that is doped with acceptors, a fourth layer that is substantially undoped, and a fifth layer that is doped with donors.

9. An APD according to claim 8, wherein the fourth layer comprises a semiconductor of fundamental band gap less than that of the materials of the third and fifth layers.

10. An APD according to claim 8, wherein the second layer of a given multiplying stage comprises a material having a impact ionization threshold energy greater than or equal to that of the material of the fourth layer of that multiplying stage.

11. An APD according to claim 8, wherein the carrier relaxation region comprises a material with impact ionization threshold energy greater than or equal to that of the material of the second layer of each of the first and second multiplying stages.

12. An APD according to claim 8, comprising at least a third multiplying stage between the second multiplying stage and the cathode layer, and a second carrier relaxation region between the second and third multiplying stages, and wherein the second carrier relaxation region comprises a material with impact ionization threshold energy greater than or equal to that of the material of the second layer of each of the second and third multiplying stages.

13. An APD according to claim 8, wherein the carrier relaxation region has a thickness greater than 20 nm.

14. An APD according to claim 8, comprising at least one additional multiplying stage between the second multiplying stage and the cathode layer and, for each additional multiplying stage, an additional carrier relaxation region between the second multiplying stage and said additional multiplying stage, and wherein each carrier relaxation region is located between two consecutive multiplying stages in the direction of drift of electrons, and each additional multiplying stage is located either between two consecutive carrier relaxation regions in said direction or between a carrier relaxation region and the cathode layer.

* * * * *